United States Patent [19]
Pontius

[11] Patent Number: 5,978,437
[45] Date of Patent: Nov. 2, 1999

[54] BINARY COUNTER SYSTEM USING BIT-WISE MATCHES WITH MAXIMUM COUNT

[75] Inventor: Timothy A. Pontius, Lake in the Hills, Ill.

[73] Assignee: VLSI Technology, Inc., San Jose, Calif.

[21] Appl. No.: 09/001,116

[22] Filed: Dec. 30, 1997

[51] Int. Cl.$^6$ .................................................. H03K 21/00
[52] U.S. Cl. .............................. 377/39; 377/52; 377/110; 340/146.2
[58] Field of Search ............................. 377/39, 52, 110; 340/146.2

[56] References Cited

U.S. PATENT DOCUMENTS 3,622,987  11/1971  Borkan ................................. 340/146.2

*Primary Examiner*—Margaret R. Wambach
*Attorney, Agent, or Firm*—Clifton L. Anderson

[57] ABSTRACT

A counting system with a dynamic maximum count includes a counter, match logic, and a maximum count controller. The counter has a present count register, a clock (or event indicator) event input, and a reset input. The maximum count controller can be programmed with an adjustable maximum count stored in a maximum count register. The match logic includes a count-wide AND gate fed by NAND gates. Each NAND gate has an inverted input coupled to a respective bit position of the present count register and an uninverted input coupled to a respective bit position of the maximum count register. The function of the match logic is to indicate a match whenever the present count has a 1 at every bit position that the maximum count has a 1, irrespective of the present count values at bit positions at which the maximum count has 0s. Thus, imperfect matches are provided for. The values of the imperfect matches always exceed the values of perfect matches, so they are not usually encountered. However, in the case the maximum count is adjusted from above to below the present count, the invention achieves the desired change in rate of match indications more quickly than would be achieved if perfect matches were required. In addition, the match logic for the imperfect matches is simpler than the logic required for perfect matches. Thus, the invention provides both better functionality and a simpler implementation of a counting system.

10 Claims, 3 Drawing Sheets

BINARY COUNTER SYSTEM USING BIT-WISE MATCHES WITH MAXIMUM COUNT

BACKGROUND OF THE INVENTION

The present invention relates to data processing and, more particularly, to logic designs for data processing functions. A major objective of the present invention is to provide an improved binary-counter-based timing generator.

Much of modern progress is associated with the increasing miniaturization of integrated circuits made possible by advances in semiconductor processing technology. Despite the increasing functional density made possible by such advances, there is still a need to implement functions more efficiently and effectively.

One such function of interest is a timing generator used, for example, in a UART ("universal asynchronous receiver/transmitter") communication port. Such a timing generator can include a binary counter for counting clock transitions or other events, memory for storing a maximum count, and match logic for indicating when the binary count reaches the stored maximum count. Typically, a match indication results in an output pulse and a counter reset. The counter can then recount to the maximum count for an iterated pulse generation and counter reset. As a result, pulses are generated periodically.

Depending on the application, the maximum count can be fixed, static programmable, or dynamic (programmable or otherwise). A fixed maximum count can be implemented where there is no need to change the timing period or where the timing period can be adjusted by adjusting the rate of the clock or events being counted. A static programmable maximum count applies where a communications rate is determined after a negotiation between communications devices, e.g., modems, and remains constant once set. A dynamic maximum count applies in applications where a communications rate is regulated to match changing line conditions. The most sophisticated communications systems provide for a dynamic maximum count to continually optimize the communications rate during changing conditions.

Where the maximum count is fixed, it can be hardwired into the match logic. For example, the match logic can include an AND gate with one input for every bit position of the maximum count (expressed in binary notation). For maximum-count bit positions having a 0, the AND input is inverted; for maximum-count bit positions having a 1, the AND input is not inverted. The inverted and uninverted inputs are coupled to respective bit position outputs of the counter. If the counter provides complementary outputs for each bit position, the inverters can be dispensed with and the AND-gate inputs corresponding to maximum-count 0s can be tied to the negative output for the corresponding bit positions.

Where the maximum count is static and programmable, the maximum count is stored in rewrittable memory and the match logic provides for any valid maximum count. A typical approach is to use XNOR gates at each bit position to yield a positive indication whenever the present count and maximum counts at that bit position match. An AND gate then indicates when all the XNOR gates indicate a match. Alternatively, XOR logic can be used instead of the XNOR logic.

This same match logic can be applied to dynamic maximum counts; however, there are cases where the results are not optimal. For example, if, when an eight-bit counter counts reaches 20, the maximum count is changed from 21 to 19, the counter counts to 255, recycles to 0, and counts up to 19 before the next timing pulse was generated. This would result in one period that was an order of magnitude larger than desired, and would delay the onset of the desired periodicity. In practice, the delay can be much larger. Counters as wide as 128 bits are sometimes used to provide a full range of baud rates for a communications systems; for such counters, the "skip" period can be multiple orders of magnitude larger than desired. One option is to reset the counter every time the maximum count is changed. This would avoid the specific problem mentioned above, but in many more cases would extend the timing period undesirably. For example, if when an eight-bit counter reaches 20, the maximum count is changed from 21 to 22, the period would be almost twice the desired period. In cases where the maximum count changes frequently, the maximum count might never be reached. Of course, there are ways to address each of these problems, but their cost in terms of additional circuit complexity must be considered. What is needed generally is a system for indicating matches between present counts and maximum counts that avoids unduly lengthy timing periods when the maximum count is changed. Preferably, such a system would use less complex rather than more complex match logic.

SUMMARY OF THE INVENTION

The present invention provides for match indications not only when a present count completely matches a maximum count, but also when a present count is greater than the maximum count at one or more bit positions. Preferably, a match is indicated if, for every bit position, the value of the present count is greater than or equal to the value of the maximum count. In other words, if the maximum count value is 1, then the present count value is 1, and if the maximum count value is 0, the present count value can be either 0 or 1. However, if for any bit position, the value of the maximum count exceeds the value for the present count, i.e., the maximum count is 1 and the present count is 0, then no match is indicated.

While it is preferably applied across the entire count width, the invention can be applied to any non-empty subset of count bit positions. In other words, the invention only requires that a bit-wise match indication be provided for at least one bit position when the present count value is one and the maximum count value is 0. At other bit positions, this condition need not result in a bit-wise match indication. However, in the preferred embodiments, a bit-wise match indication is made for every bit position when the present count value is 1 and the maximum count value is 0.

The invention provides for fixed, static programmable, and dynamic implementations. In accordance with the invention, a counting system for which the maximum count is fixed comprises a counter and match logic. The maximum count is embodied in the match logic. The match logic can include an AND gate that has an input coupled to each present count bit position at which the maximum count has a 1.

The match logic is considerably simplified relative to the prior art, since no inverters are required and the number of AND gate inputs is the number of maximum count 1s rather than the number of bit positions in the counts. However, inverters and additional AND-gate inputs are required for each bit position at which the maximum count is 0 but equality is required for a bit position. Partly for this reason, the preferred embodiments do not require equality at any bit positions at which the maximum count is 0.

A programmable-static realization of the invention provides for bit-wise comparisons of the present and maximum counts at every bit position. A programmable realization of the invention comprises a counter, match logic, and programmable storage for storing the maximum count. A two-input NAND gate with one inverted input can be used to make bit-wise match determinations for each bit position at which a bit-wise match indication is to be made even when the present count value exceeds the maximum count. The inverted input is coupled to the respective bit position of the present count, while the uninverted input is coupled to the respective bit position of the maximum count.

Logic equivalent to the NAND gates can be used. For example, NOR gates each with an inverted input coupled to a maximum count bit and an uninverted input coupled to the respective present count bit can be used.

The outputs of the bit-wise logic elements can be coupled to an AND gate or other count-wide logic to make the system-wide match determination. Since, on a circuit level, NAND gates are simpler than XNOR gates, programmable implementations of the invention are simpler than comparable prior art systems that employ XNOR gates instead of NAND gates.

Dynamic implementations of the present invention comprise a counter, match logic, and a controller that provides for adjusting the maximum count during counting. The match logic for a dynamic implementation can be the same as the match logic for a static-programmable implementation. Accordingly, there is a simplification afforded on the circuit level due to the use of NAND gates instead of XNOR gates for the bit-wise match determinations.

Another important advantage that accrues in the dynamic implementations is that the desired functionality is achieved more readily in cases where the maximum count is decreased from above the present count to below the present count. The present invention provides that the desired change in the system output of the decrease in maximum count will be effected much sooner that it would be using a prior art system. Whereas a prior art system would require the present count to reach a maximum, recycle to zero, and then count to the new maximum count, the present invention would only require the present count to reach the next match. In many cases, the system response time is dramatically improved over the prior art.

The present invention provides for methods that correspond to these implementations. System initialization can include setting a counter to zero, and, for programmable and dynamic implementations, setting a maximum count. Counting can begin, and in a dynamic implementation, the maximum count can be adjusted. The match logic can make match determinations; for programmable systems, this can be made first on a bit-wise basis and then on a count-wide basis. Finally, the counter can be reset when a match is indicated.

In accordance with the foregoing, the present invention provides for improved functionality in dynamic implementations of the invention, circuit simplification in programmable implementations of the invention, and circuit and logic simplification in fixed implementations of the invention. These and other features and advantages of the invention are apparent from the description below with reference to the following drawings.

DESCRIPTION OF THE PREFERRED EMBODIMENTS

Figure 1:
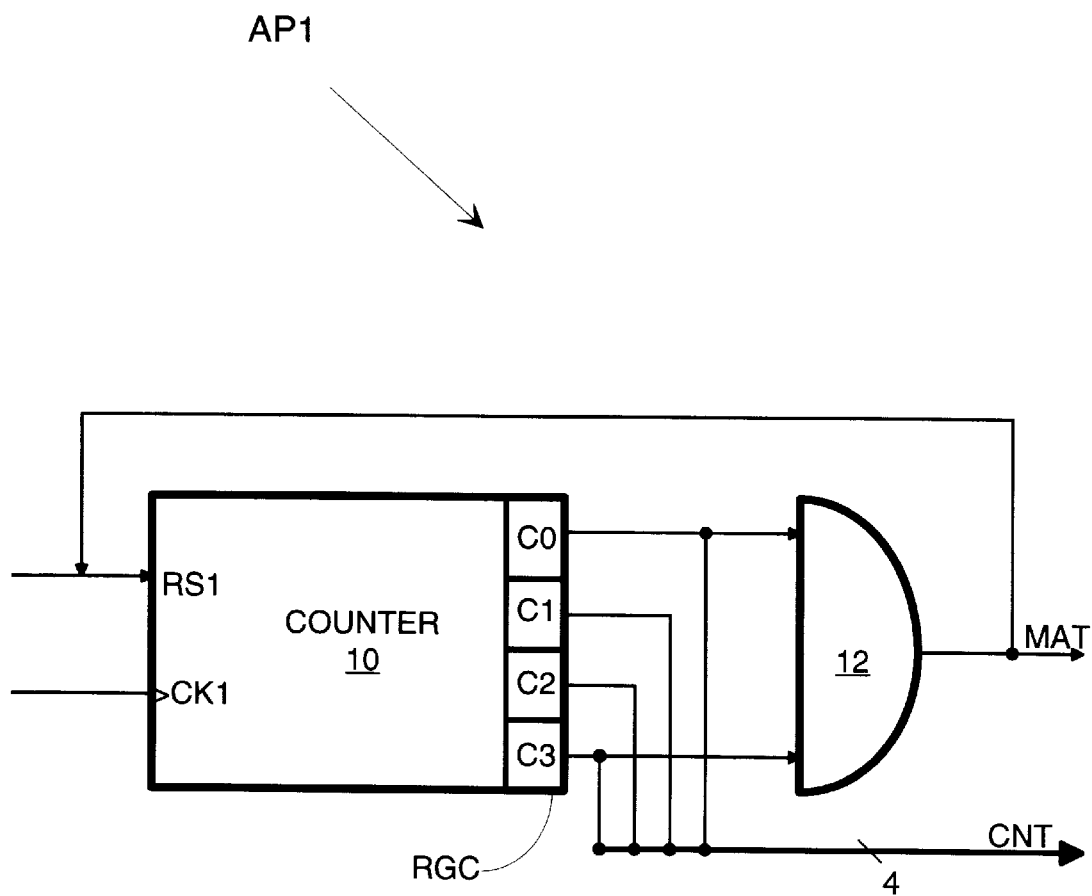
FIG. 1 is a counter system in accordance with the present invention and having a fixed maximum count.

In accordance with the present invention, a static counter system AP1 comprises a four-bit counter and a two-input AND gate 12, as shown in FIG. 1. Counter 10 includes a count register RGC, a clock input CK1 and a reset input RS1. Register RGC has four bit-storage positions C0, C1, C2, and C3. Bit positions C0 and C3 have outputs coupled directly to the inputs of AND gate 12. The output of AND gate 12 is coupled to the reset input RS1 of counter 10.

Clock input CK1 and reset input RS1 serve as inputs to system AP1. Counter register RGC provides a count output CNT from system AP1, while the output of AND gate 12 serves as the match indication output MAT of system API. An active high at reset input RS1 sets register RGC to 0000, while a positive transition received at clock input CK1 (while reset RS1 is low) increments register RGC. The function of system of AP1 is to generate one output pulse for every 10 pulses received at clock input CK1. In effect, system AP1 is a 1:10 clock frequency divider.

Initially, an active high signal applied to reset input RS1 sets register RGC to 0000. The external connection to reset input RS1 is then placed in a high-impedance state so that the reset input is controlled by the output of AND gate 12 during counting. When RGC=0000, the inputs to AND gate 12 are low, so the output of AND gate 12 is low, and reset input RS1 remains low.

When a first positive transition is received at clock input CK1, counter 10 increments count register RGC to 0001. Subsequent positive transitions at clock input CK1 increment count register RGC successively to 0010, 0011, 0100, 0101, 0110, 0111, 1000. None of these values change the low output of AND gate 12.

The next positive transition received at clock input CK1 causes the count to be incremented to 1001. This sets both inputs to AND gate 12 high, so the output of AND gate 12 goes high. Thus, the output of system AP1 goes high. In addition, the reset input RS1 of counter 10 goes high, resetting counter 10 to 0000. This, in turn, sends both inputs to AND gate 12 low. Thus, the output of AND gate 12 goes low. Accordingly, a system AP1 outputs a brief pulse each time counter 10 reaches 1001=9.

The low output from AND gate 12 also releases reset input RS1 so that counting can resume from 0000. Each time the count reaches 1001, system AP1 generates an output pulse. Each cycle includes ten counts 0–9; thus, system AP1 serves as a 1:10 clock divider or an event counter that counts events by tens. Note that this function is accomplished using a two-input AND gate as opposed to the four inputs and two inverters that are used in the prior art.

Figure 2:
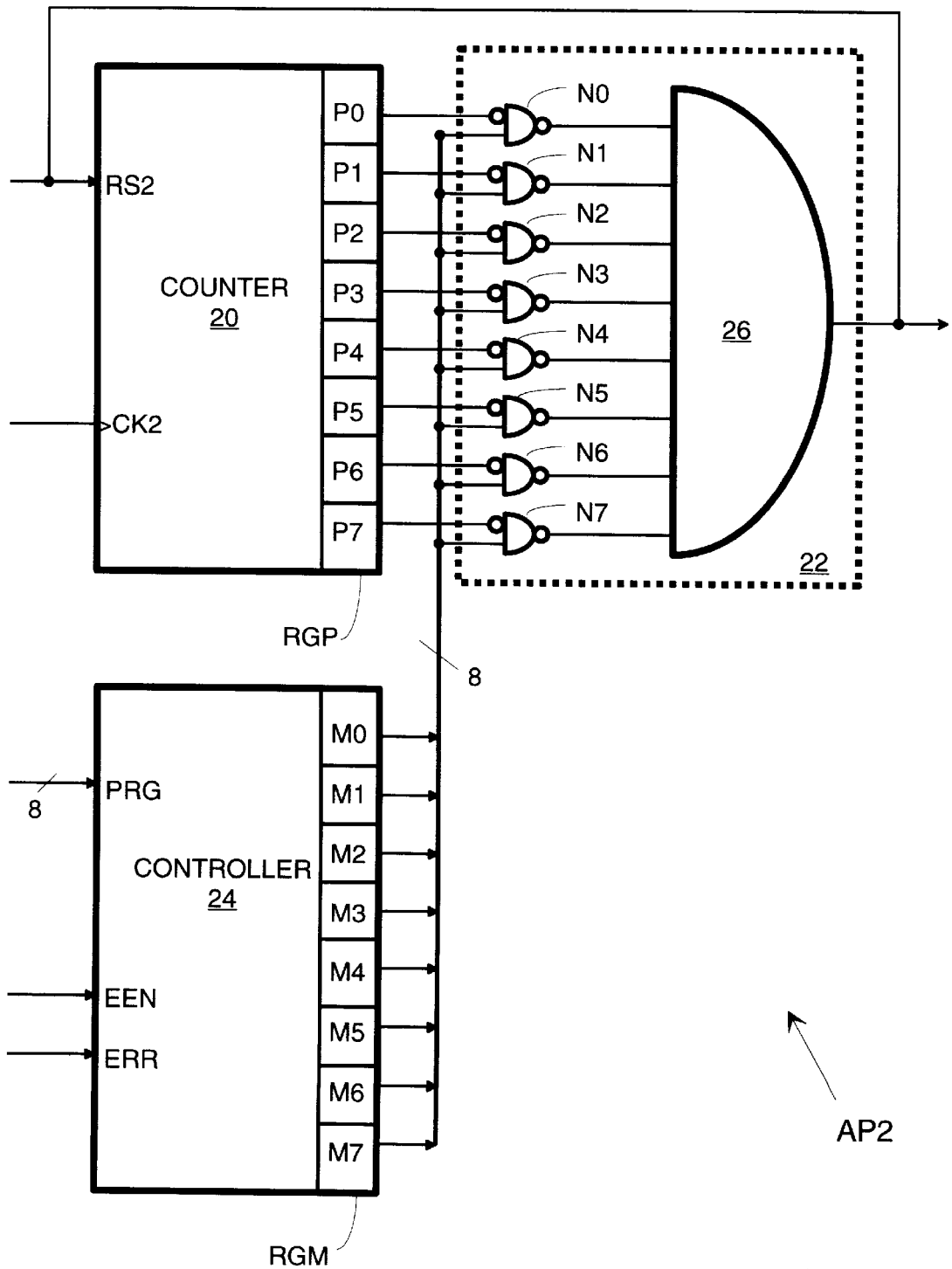
FIG. 2 is a counter system in accordance with the present invention and having a dynamic maximum count.

A dynamic counter system AP2 is shown in FIG. 2, comprising an eight-bit counter 20, system-wide match logic 22, and a controller 24. Counter 20 includes a present count register RGP with eight bit positions P0–P7. Counter 20 has a reset input RS2 and a clock input CK2, which function analogously to inputs RS1 and CK1 of system AP1.

Controller 24 has a maximum count register RGM with eight bit positions M0–M7. Controller 24 has an eight-bit program input PRG, an analog error input ERR, and an error-enable input EEN. Eight-bit program input PRG is used to set an eight-bit value to be stored in maximum-count register RGM. Eight-bit program input PRG can tri-stated during counting, effectively disabling this input.

If error-enable input EEN is held low, error input ERR is inactive and the value of the maximum count stored in register RGM remains constant during counting. If error-enable input EEN is held high, error input ERR is active. In that case, controller 24 changes the maximum count in a direction opposite to the sign of the error signal and by a magnitude correlated with the magnitude of the error signal. In the context of an incorporating system, this change is directed to minimizing the magnitude of the error signal.

Match logic 22 includes a bank of NAND gates N0–N7 and an eight-input AND gate 26. The NAND gates provide bit-wise match indications. The AND gate provides count-wide match determinations.

Each NAND gate N0–N7 has an inverted input, an uinverted input, and an output. The inverted input of each NAND gate N0–N7 is coupled to a respective bit position P0–P7 of present count register RGP. The uninverted input of each NAND gate N0–N7 is coupled to a respective bit position M0–M7 of maximum count register RGM. The output of each NAND gate N0–N7 is coupled to a respective input of AND gate 26. Thus, the output of system AP2, which is the output of AND gate 26, is high only when the outputs of NAND gates N0–N7 are all high. Each NAND gate N0–N7 implements the following truth table.

| Present Count | Maximum Count | NAND Output |
|---|---|---|
| 0 | 0 | 1 |
| 0 | 1 | 0 |
| 1 | 0 | 1 |
| 1 | 1 | 1 |

As the foregoing truth table indicates, the output of each NAND gate N0–N7 is high whenever there is a match 0=0 or 1=1. In addition, the output of a NAND gate is high whenever the present count is 1 and the maximum count is 0. In other words, whenever the maximum count is 0, a bit-wise match is indicated. Also, whenever, the present count is 1, a bit-wise match is indicated. When the present count is 0 and the maximum count is 1, the output of the respective NAND gate is low, indicating a bit-wise mismatch. These conditions can be summarized as the present count must be equal to or greater than the maximum count at every bit position.

The unconventional case (indicated in bold in the truth table) is the indication of a bit-wise match when the present count is 1 and the maximum count is 0, this case is indicated in bold in the truth table. This case is generally not problematic because such nonequivalence matches do not normally occur because an equivalence match occurs at a lower count. For example, if the maximum count is 0001,0101=21, and the present count is 0001,0111=23, a nonequivalence match is indicated despite the difference is the second-least significant bit. However, before that present count is reached, an equivalence match will have been indicated when the present count is 0001,0101=21. Assuming the lower match results in a reset, the present count of 0001, 0111 will not be reached.

However, there are cases in which an nonequivalence match can be achieved. For example, if when the present count is 0001,0100=20, controller 24 reduces the maximum count from 0001,0101=21 to 0001,0011=19. Such a reduction might occur in response to an indication received at error input ERR that the timing period is too long. In this case, the maximum count has already been exceeded. The next nonequivalent count-wide match occurs at 0001,0111= 23, with a nonequivalence bit-wise match at the third least significant bit. This result is not ideal in that the period is increased by two clocks rather than being decreased by two clocks. However, this is much better than the prior art result, which would require a count to 63, recycle to 0, and count of up 19, resulting in a period of 83 clocks.

Figure 3:
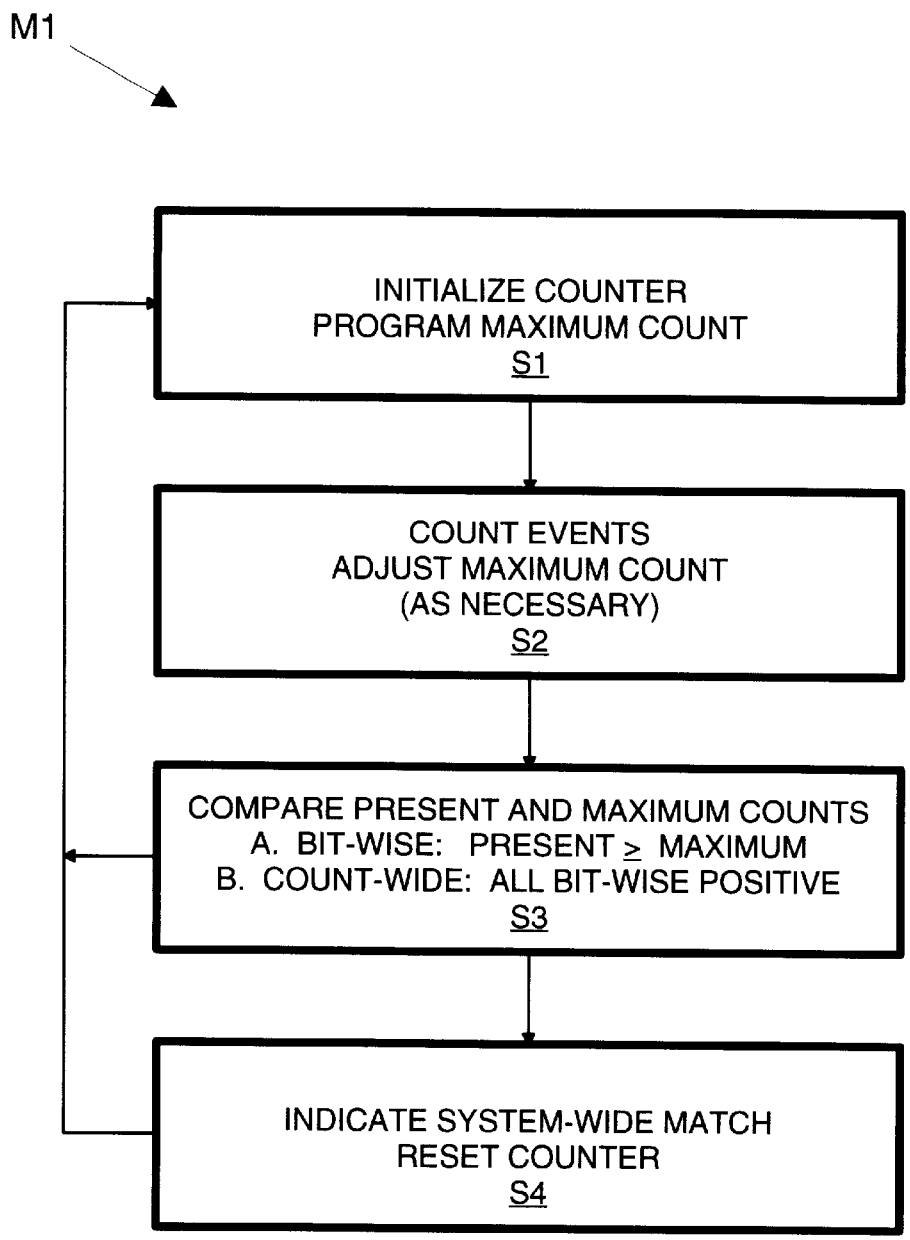
FIG. 3 is a flow chart of a method of the invention practiced in the context of the system of FIG. 2.

A method of the invention practiced in the context of counter system AP2 is flow charted in FIG. 3. System AP2 is initialized at step S1. A reset signal is input to system AP2 and provided to reset input RST of counter 20. Thus, present count register is initialized to 0000,0000. Program input PRG of controller 24 receives an initial maximum count, e.g., 0001,0101=21. The program input PRG is tri-stated and an active signal at input EEN activates error input ERR.

At step S2, the present count is incremented for each clock transition or other event indication received at clock input CK2 of counter 20. Each positive-going transition results in an incrementing of the present count. Step S2 also provides for adjustment of the maximum count. The adjustments are made synchronously relative to the counting.

Step S3 involves comparison of the present and maximum counts. A match is indicated if the present count has a 1 at every bit position that the maximum count has a 1; otherwise, no match is indicated.

Step S3 includes two substeps. At substep A, a bit-wise match determination is made. For each bit position, a match indication is made if the value at that bit position of the maximum count is 1 or if the value at that bit position of the present count is 0. If the value at that position of the maximum count is 1 and the value at that bit position of the present count is 0, a bit-wise match indication is not made for that bit position. Substep B involves making a count-wide match determination.

If a bit-wise match is indicated for every bit position, a count-wide match determination is positive; otherwise, it is negative. In the later case, method M1 recycles to step S2.

If the count-wide match determination is positive, then, at step S4, a system-wide match indication is output and the present count is reset. Then method M1 returns to step S2. Method M1 then iterates through steps S1–S3 and steps S1–S4.

The present invention provides for many variations upon the foregoing embodiments. For example, the structure and method according to which the maximum count is adjusted can differ. For example, a program input can be left active during counting and provide new counts as appropriate. Counters of different widths are provided for. Different uses can be made of the match indications.

The invention applies to systems that change the maximum count for a variety of reasons. The invention applies to systems that change a frequency by adjusting the maximum count; for example, the invention can be applied to frequency synthesizers used for music, digital FM signaling, radar, etc. The invention can also be applied to maintain an output frequency when a clock rate is changed. Some systems change the frequency of a system clock (used to drive a central processor as well as the counter) to save power when the processor is not busy; the invention provides for adjusting the maximum count to compensate for changes in the system clock frequency to maintain a constant rate of count-wide match indications.

Different match logic can be used. NOR gates can be used instead of NAND gates. For example, inverted NOR-gate inputs can be coupled to the maximum count bit positions, while uninverted NOR-gate inputs can be coupled to the present count bit positions. Other logical equivalents can be used. Furthermore, an equivalence match can be required for some non-exhaustive subset of bit positions. These and other variations upon and modification to the present invention are provided by the present invention, the scope of which is limited only by the following claims.

What is claimed is:

1. A counting system comprising:

a binary counter for providing a present count;

a controller for providing a dynamic maximum count; and match logic for indicating a match whenever said present count has a 1 at every bit position that said maximum count has a 1.

2. A counting system comprising:

a counter for providing a present count; and system-match logic for indicating a match when said present count matches a maximum count at every bit position and when said present count does not match said maximum count at every bit position but does match said maximum count at every bit position at which said maximum count has a 1, but not when said present count differs from maximum count at a bit position at which said maximum count has a 1.

3. A counting system as recited in claim 2 wherein said system match logic indicates a match whenever said present count matches said maximum count at every bit position that said maximum bit position has a 1.

4. A counting system as recited in claim 2 further comprising a memory for storing said maximum count.

5. A counting system as recited in claim 4 wherein said system match logic includes:

bit-wise match logic for indicating a bit-wise match for each bit position of said present count and said maximum count whenever the value of said maximum count at said bit position is not greater than the value at the same bit position of said present count; and count-wide match logic for indicating a count-wide match when said bit-wise logic indicates a bit-wise match at every one of said bit positions.

6. A counting system as recited in claim 5 further comprising a controller for adjusting said maximum count.

7. A binary counting method comprising the steps of:

counting so as to provide an incrementing binary present count;

providing a system-match indication when said present count matches a maximum count and when said present count exceeds said maximum count at at least one bit position but said maximum count does not exceed said present count at any bit position.

8. A method as recited in claim 7 further comprising a step of storing said maximum count before said counting step.

9. A method as recited in claim 8 further comprising a step of adjusting said maximum count during said counting step.

10. A method as recited in claim 9 wherein said indicating step involves:

providing bit-wise match indications for each bit position at which the value of said present count is greater than or equal to the value of said maximum count, but not when the value of said maximum count is greater than the value of said present count; and providing said system match indication when a bit-wise match indication is provided for all bit positions of said present count.

* * * * *

UNITED STATES PATENT AND TRADEMARK OFFICE
CERTIFICATE OF CORRECTION

PATENT NO. : 5,978,437
DATED : November 2, 1999
INVENTOR(S) : Timothy A. Pontius Page 1 of 1

It is certified that error appears in the above-identified patent and that said Letters Patent is hereby corrected as shown below:

Title page:

Item [54] should read --BINARY COUNTER SYSTEM USING "$\geq$" BIT-WISE MATCHES WITH MAXIMUM COUNT--

Signed and Sealed this

Second Day of October, 2001

Attest:

*Nicholas P. Godici*

NICHOLAS P. GODICI
*Attesting Officer*  *Acting Director of the United States Patent and Trademark Office*